United States Patent
Van Veen et al.

(10) Patent No.: US 8,268,672 B2
(45) Date of Patent: Sep. 18, 2012

(54) METHOD OF ASSEMBLY AND ASSEMBLY THUS MADE

(75) Inventors: Nicolaas Johannes Anthonius Van Veen, Eindhoven (NL); Hendrik Pieter Hochstenbach, Nijmegen (NL)

(73) Assignee: NXP B.V., Eindhoven (NL)

( * ) Notice: Subject to any disclaimer, the term of this patent is extended or adjusted under 35 U.S.C. 154(b) by 1249 days.

(21) Appl. No.: 11/579,677

(22) PCT Filed: Apr. 28, 2005

(86) PCT No.: PCT/IB2005/051397
§ 371 (c)(1),
(2), (4) Date: Nov. 5, 2007

(87) PCT Pub. No.: WO2005/109503
PCT Pub. Date: Nov. 17, 2005

(65) Prior Publication Data
US 2011/0275176 A1    Nov. 10, 2011

(30) Foreign Application Priority Data
May 6, 2004  (EP) .................................. 04101963

(51) Int. Cl.
*H01L 21/00*    (2006.01)

(52) U.S. Cl. ................ 438/109; 257/E21.196

(58) Field of Classification Search .......... 438/106–112, 438/123, 122, 101, 118; 257/E21.196
See application file for complete search history.

(56) References Cited

U.S. PATENT DOCUMENTS

| 6,070,788 A | 6/2000 | Zakel |
| 6,294,406 B1 | 9/2001 | Bertin et al. |
| 6,773,247 B1 * | 8/2004 | Osada et al. ............... 425/89 |
| 6,844,619 B2 | 1/2005 | Tago |
| 7,112,878 B2 * | 9/2006 | Akram ....................... 257/686 |
| 2002/0074668 A1 | 6/2002 | Hofstee et al. |
| 2002/0105789 A1 | 8/2002 | Chen et al. |

FOREIGN PATENT DOCUMENTS

| EP | 0248314 A2 | 5/1987 |
| EP | 1 100 123 | 5/2001 |
| JP | 63054738 A | 3/1988 |
| JP | 02 005455 | 1/1990 |
| JP | 2002124533 A | 4/2002 |
| JP | 200270918 A | 6/2002 |
| WO | 96/08337 A1 | 3/1996 |

* cited by examiner

*Primary Examiner* — Hoa B Trinh

(57) ABSTRACT

An assembly (100) is provided comprising a first chip (20) and a second chip (30) which are interconnected through solder connections. These comprise, at the first chip, an underbump metallization and a solder bump, and, at the second chip, a metallization. In this case the solder bump is provided as a fluid layer with a contact angle of less than 90° C., and an intermetallic compound is formed on the basis of the metallization at the second chip, and at least one element of the composition is applied as the solder bump.

16 Claims, 2 Drawing Sheets

METHOD OF ASSEMBLY AND ASSEMBLY THUS MADE

The invention relates to a method of assembly of a first chip to a second chip comprising the steps of:
providing a plurality of bond pads at a surface of the first chip with a solder composition, said bond pads being provided with an underbump metallisation;
providing the second chip, which, at a surface, has a plurality of bond pads on which a metallisation is present;
assembling the first and the second chip, such that at least part of the bond pads of the first chip and the corresponding bond pads of the second chip face each other, and
forming electrical connections between the bond pads at the first and the second chip by heating.

The invention also relates to an assembly of a first chip and a second chip, both of which comprise a surface with bond pads that are exposed in apertures in a passivation layer, said surfaces facing each other, and a plurality of bond pads on the first chip being electrically connected to corresponding bond pads on the second chip through a solder interconnection.

Such a method and such an assembly are for instance known from JP-A 02-005455, as published on 10 Jan. 1990. This assembly comprises an underbump metallisation of Cr and Cu, and a bump of Au. This bump is then connected to a bump at the bond pad of the second chip, and heated to form the interconnection.

Experimental work done with bumps of Au made use of the thermocompression technique. The bond pads at the second chip were made of Al, and were provided in some experiments with gold bumps. Reliability tests were carried out on the bumps thus made, which gave negative results.

It is therefore an object of the present invention to provide an improved bumping method for chip-on-chip applications.

This object is achieved in that the solder composition is provided as a fluid layer on the underbump metallisation, which layer makes a contact angle of less than 90° with the underbump metallization, and an intermetallic compound is formed on the basis of the metallisation at the second chip and at least one element of the solder composition.

The method of the invention uses a very thin solder layer that is sandwiched between the underbump metallisation and the metallisation at the second chip. In order to provide a stable interconnection, the solder composition and the metallization at the second chip are chosen such that an intermetallic compound is formed at the interface of both. This has resulted in a good reliability, both in the final product and during the manufacture. With the larger gold bumps the problem occurred that two neighbouring bumps spread out and consequently flowed together. By virtue of the small solder volume in the method of the invention, this risk is substantially reduced.

An additional advantage of the present method resides in that it allows a very fine pitch. The pitch is defined in the field as the distance between the center of two neighbouring bond pads. The prior art method does not allow a fine pitch in view of the processing requirements. This method starts with an adhesion layer of TiAu or TiW, after which a photoresist layer is applied and patterned. Then, metal is provided to act as underbump metallisation and/or bump. In view of the required bump height, the layer thickness is substantial. If the holes in the photoresist layer are rather small, the hole may not be filled adequately and no reliable product is obtained. In the method of the invention, a photoresist, if needed at all, is required only for the provision of the underbump metallisation. The thickness of this metallisation is clearly smaller than that of the bump, and hence, the diameter of the holes in the photoresist can be reduced correspondingly.

Another advantage thereof is that bond pads with different sizes can be applied, which may all have an underbump metallisation of the same thickness and still function adequately.

The solder compositions can be applied in different manners, however, irrespective thereof they all have a relatively small height of 5 to 20 μm. As a result, the interspace between the first and the second chip is very small. This is not problematic as the chips both have a semiconductor substrate with at least approximately the same coefficient of thermal expansion, In view of this, it is preferred that the contact angle is substantially smaller than 90°, preferably less than 60°, and more preferably 45° or less.

It is a further advantage of the present invention that there is sufficient tolerance with regard to non-planarity. This tolerance is desired in order not to be compelled to exert substantial force during the bonding process. The non-planarity tolerance is achieved by the melting of the bump during the heating step.

In a preferred embodiment, the metallisation at the bond pads of the second chip has a flattened surface. This feature has a beneficial effect on the prevention of planarity problems. Some non-planarity tolerance is needed in order not to be compelled to exert force during the process of bonding the chips together. The flattening of the metallisation effectively leads to an increase of the tolerance in the provision of the underbump metallisation and particularly in the provision of the solder composition. The flattened surface can be achieved by electroplating the metallisation at the second chip. Additionally, or alternatively, an additional planarisation treatment can be carried out at the second chip after the provision of the metallisation, particularly in the case that this metallization is of the 'studbump' type. The metallization at the second chip usually has a thickness of the order of 10-50 microns, preferably in the range of 20-40 microns, and is dependent on the bumping surface. The flattened surface is understood herein to have a thickness variation within one individual surface of less than 2.5 microns, preferably less than 1.0 micron, and more preferably less than 0.5 microns. The coplanarity of the individual bumping surfaces is in any case smaller than 10 microns, and highly preferably at most 5.0 microns, and more preferably at most 2.0 microns.

An important feature of this embodiment is that the leveled metallisation in combination with the exerted pressure during bonding has the consequence that the metallization has a larger diameter than the solder composition. This has the advantageous effect that the complete interface between the solder layer and the metallization falls within the diameter of the metallization and is substantially flat. As a result, the risk of voids and failures at this interface is substantially reduced, if not completely absent.

Generally, the bond pads with the metallizations are laterally present as islands within a passivation layer. This embodiment was found in practice to provide a further barrier against the spreading of the solder, as the solder composition was not able to wet the surface of the passivation layer. Besides, in comparison with solder resists or organic rerouting layers, a passivation layer tends to have a very planar surface. As a consequence, non-planarity problems are prevented to a large extent. Moreover, the passivation layer turned out to have a good adhesion to any underfill. It is however possible that the first substrate is provided with an underfill layer before the assembly of both chips takes place. The underfill layer, particularly comprising a polyimide or polyacrylate, can be provided as a foil on the first chip. It will liquefy under gentle heating to approximately 100° C. Due to the weight of the second chip and the force, if any, applied to the second chip, the second chip will sink through the liquefied layer and make contact with the solder composition.

In another embodiment, the first chip is provided with further bumps of a larger height on top of the solder composition, said first chip extending laterally beyond the second chip. Different assembly techniques could be used for the provision of contact between the system of the first and second chip and a printed circuit board. Such techniques include wirebonding, end contacts at the side faces of or vertical interconnects through the first chip to a surface facing away from the second chip, the provision of a flexfoil and the use of another flip chip level. It has been found that the interconnection to a carrier—either a leadframe or an external board—can be provided with a flip chip technique, in which the bumps are provided on top of the solder connection. A suitable material for the bumps is the tin-silver-copper solder, but lead-tin is one of many alternatives. For this combination the solder composition preferably comprises tin. These further bumps may be provided on the first chip before the second chip is assembled to the first chip.

The solder composition of the invention is preferably applied using a technique that is known per se as immersion soldering. This technique is for instance disclosed in WO-A 96/08337. The immersion soldering technique is known to be applicable for the connection of chips on flexible carriers. The conductors at the flexible carrier extend adjacent to the bond pad, e.g. are not covered by any passivation layer. As a consequence, the bump spreads out, and it would be very difficult to overcome the non-planarity problems that are present when assembling two rigid chips. For flexible carriers, these non-planarity problems are however absent.

The heating step is advantageously carried out using the technique of thermode bonding. In this step the first chip is gently heated, for instance in the range of 60-125° C., whereas the second chip is heated to a temperature at which the intermetallic compound in the desired phase will form. For the creation of an AuSn intermetallic of the ξ-phase, with $Au_xSn_{1-x}$ and $0.1 \leq x \leq 0.3$, this temperature is about 300° C. This thermode bonding is very much preferred in combination with the immersion soldering technique.

A plurality of options are available for the solder composition. First, there are different options for the alloying element; this element may be tin, indium and also thallium and gallium. Then there are different options for other elements in the solder composition. These are basically zinc, bismuth, copper, indium, gold, silver and lead. Lead however is not preferred in view of the lead-free requirements. It is preferred to have solder compositions with a relatively low melting point; this reduces the risk of formation of needle-like crystals with the underbump metallisation, particularly in case that this comprises nickel. Preferred examples of such alloys include SnCu and $SnBi_xIn_yZn_z$, wherein at least one of x, y and z is larger than zero, as well as BiIn, BiInZn, BiCu.

There are two major embodiments for the underbump metallisation and the bump at the first chip, particularly in combination with the solder composition comprising Sn. In a first embodiment, the underbump metallisation comprises nickel, and the bumps are provided by immersion of the first chip into a bath of a low-melting Sn alloy. Nickel can, in this embodiment, be applied by using an electroless treatment. This treatment has the advantage that no additional mask is needed for the provision of the underbump metallisation; this moreover allows a further reduction of the pitch to for instance 10 microns. However, if this underbump metallization is immersed in a bath of pure tin at a temperature of approximately 250° C., then NiSn intermetallics are formed. And they are formed in the form of needles that protrude through the bump surface. This does not give a useful result. The formation of these intermetallics can be prevented through the use of a low-melting Sn-alloy. Examples of such alloys include SnPb, SnCu and $SnBi_xIn_yZn_z$, wherein at least one of x, y and z is larger than zero. Preferably, a lead-free solder is applied. Advantageously, the alloying elements do not interfere in the reaction between Sn and the metal of the metallisation—particularly Au.

In an advantageous modification, the nickel underbump metallization is provided with a gold adhesion layer before the immersion into the bath. Such a gold adhesion layer is needed for maintenance of solderability. However, it has been found that such a gold layer is not needed when the immersion step is carried out directly after the provision of the nickel underbump metallization.

In a second embodiment, the underbump metallization comprises copper. A typical height of the copper is of the order of 10-15 µm. If the bond pad already comprises Cu, this copper could be applied as part of the bond pad. However, generally, this underbump metallisation will be provided by electroplating. The copper is provided with an adhesion layer of Au, and a bump of Sn or any Sn-alloy. Preferably, the bump is applied galvanically. This second embodiment turned out to have excellent reliability.

In a further modification, a metallisation of Au is applied at the bond pads of the second chip. Alternatives include Ni and Cu. A further alternative for the metallisation and the bump at the second chip, is the use of the same, or a similar, stack as that at the first chip, e.g. Cu or Ni(Au) with a fluid layer of solder.

It is a second object of the present invention to provide an assembly of a first chip and a second chip with a very good reliability and preferably a small pitch. This is achieved in that both chips comprise a surface with bond pads that are exposed in apertures in a passivation layer, said surfaces facing each other, and a plurality of bond pads on the first chip being electrically connected to corresponding bond pads at the second chip through a solder interconnection. This solder interconnection is a layer sandwiched between a first underbump metallisation and a second metallisation, which layer has a thickness that is smaller than that of the metallisations, an intermetallic compound being present at an interface of said layer and said second metallisation.

Experiments have shown that the assembly has a very good reliability. The assembly furthermore has the advantage that the interconnection can be made at low cost. Due to the reduced thickness of the interconnection, the use of noble materials is drastically reduced. Also, there is no need for placement of individual bumps either at the first chip or at the second chip. Instead thereof, use is made of wafer-level processes using galvanic, electroless and/or immersion processes for the deposition of layers. Preferably, the length of the solder interconnection is less than 50 µm, and more preferably less than 40 microns.

In an advantageous embodiment, the intermetallic compound is chosen from the group of AuSn and CuSn. The interconnection based on an alloy of Sn with a noble metal allows the use of fine pitch processes. The use of a plating process for the provision of Sn allows a minimum pitch of 50 to 60 µm. The provision of the Sn alloy with immersion solder allows a minimum pitch of about 30 µm. This allows a very high number of interconnections between the first chip and the second chip. This high number of interconnections and the small height and resistance allows functionality to be shifted from the first chip to the second chip or vice versa. For instance, certain interconnects could be shifted from the second chip to the first chip, allowing the number of on-chip interconnection levels at the first chip to be reduced. Moreover, the second chip can be effectively used to include inductors and ground planes.

The chip-on-chip can be applied for different applications. It could well be a combination of a memory chip and a logic chip. It could be the combination of an identification chip and a microprocessor. It could also be the combination of an integrated circuit and a passive chip, comprising decoupling capacitors and inductors. This latter combination is preferred. The advantage thereof is that, moreover, the integrated circuit can be provided with a standard metallization, such as copper or gold, while the passive chip can be provided with the immersion soldering technique. In other words, any standard integrated circuit can be combined with the passive chip. This is particularly advantageous if more than one integrated circuit or other electronic component such as BAW, MEMS or antenna is applied. Moreover, the immersion soldering technique is relatively low cost, which fits with the application in which the passive chip may not be too expensive.

It is advantageous, particularly for high frequency applications, and allowable on the basis of the fine pitch, that the bond pads are provided in a chessboard pattern or a staggered array. Such a chessboard pattern allows an optimal distribution of ground and signal bumps, such that coaxial structures are constructed with a very low parasitic inductance. Larger bond pad structures, for instance ring-shaped bond pad structures, may be included to improve the electromagnetic shielding of the integrated circuit.

It is furthermore possible that a second chip with a different constitution and functionality is assembled to the first chip so as to form the assembly of the invention. It is therefore suitable that the underbump metallisation is present at the surface of the first chip that acts as the carrier; it is very simple to provide a component with a metallisation of a noble metal or the like.

These and other aspects of the invention are apparent from and will be elucidated with reference to the embodiments described hereinafter.

In the drawings.

The Figures are not drawn to scale and several parts are shown enlarged for clarity. Like reference numerals in different Figures refer to like or comparable parts. The embodiments are merely intended as examples and must not be understood as limiting the protective scope.

Figure 1A:
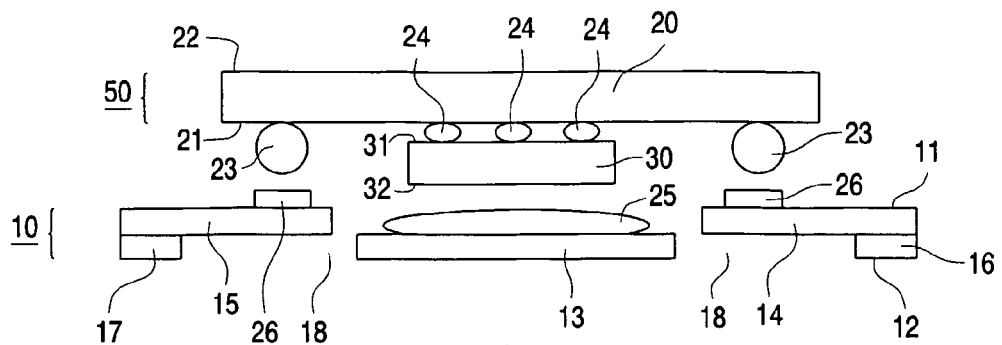
FIGS. 1A-1D show cross-sectional views of different stages in the method.

FIG. 1A shows a first step in the method in which a carrier 10 and an ensemble 50 of a first chip 20 and a second chip 30 are provided. The first chip 20 and the second chip 30 each have an active side 21, 31 and a backside 22, 32. On the active side the elements are defined, i.e. an integrated circuit of passive components in the first chip 20 and an integrated circuit of active elements in the second chip 30. The second chip 30 in this example comprises a silicon substrate, but may also contain a substrate of, for example, a III-V material. The first chip 20 and the second chip 30 each have, on their active side 21, 31, a metallization comprising—first—bond pads, which is not shown for clarity. Corresponding bond pads on the first and the second chip 20, 30 are mutually connected to first interconnections 24. The first metal interconnections 24 may be embedded in the underfill layer, which layer is known per se. The first chip 20 further comprises second bond pads (not shown either) which have solder balls 23. It should be observed that both the first and the second bond pads form a Ball Grid Array in which the pitch of the first bond pads and the height of first metal interconnections 24 are smaller than the pitch of the second bond pads and the height of the solder balls 23. The bond pads are shaped into a layer of Cu or Al. The first and second conductive bond pads on the first chip 20 are mutually electrically connected for example via the interconnections in the first chip; however a direct interconnection need not to be present.

The carrier 10 in this case is a lead frame and comprises a first side 11 and an opposite side 12. The carrier 10 comprises a first and a second electrically conductive layer of Cu. The lead frame 10 is formed by skillfully etching it, using a semi-etching technique, first from the first side 11 and then from the second side 12, or the other way around. This results in a heat sink 13, conductive interconnections 14, 15 and contact surfaces 16, 17, while the heat sink is also the contact surface. The heat sink 13 is customarily connected to the rest of the lead frame 10 by means of four wires. There is an open space 18 under the conductive interconnections 13, 14. On the first side 1, i.e. on the heat sink 13, of the lead frame 10 a conductive adhesive such as for example a silver-containing glass epoxy adhesive or a solder 25 is applied in this embodiment, which is not essential. On the first side 1 are further deposited solder dots 26, for example by printing with a stencil.

According to the invention, the second chip 30 is provided with a metallisation of Au, Cu or Ni in a thickness of about 30 µm; in this example a metallization of Au is provided. Depending on the metal of the bond pads—generally Al or Cu—the bond pads may be provided with an adhesion layer, such as NiV, TiW or the like.

The first chip 20 is provided with an underbump metallisation of—in this case—Cu at both the first and the second bond pads. The pitch of the first bond pads is 40 µm, the pitch of the second bond pads is 120 µm. This underbump metallisation is applied in a galvanic treatment with a photoresist mask and the bond pad as the plating base. Alternatively, the underbump metallisation is provided in an electroless and maskless treatment, in a thickness of for instance 10 µm.

On top of this, a layer of tin-bismuth $SnBi_{42}$ or lead-tin has been applied by immersion soldering. This layer is applied at 200-220° C., so as to prevent the formation of a NiSn intermetallic in the form of needles protruding through the solder layer. Thereafter, solder bumps of SAC solder which contains over 96% Sn, 3% Ag and about 0.5% Cu, is provided at the second bond pads of the first chip 20. The second bond pads are thus provided with a stack of an Ni underbump metallisation, a soldering layer of $SnBi_{42}$, and a solder ball.

Hereafter, the first chip 20 and the second chip 30 are assembled, such that corresponding bond pads face each other. This is done under gentle heating of the first chip 20 to a temperature of about 100° C. The second chip 30 is assembled using thermode bonding, which means that during bonding the backside of the second chip 30 is heated to a temperature of 300-350° C. In this manner an intermetallic compound AuSn is formed having a composition of approximately $Au_{80}Sn_{20}$. Although it is shown here that the first chip 20 is a single chip, it is highly preferable that the first chip 20 is still part of a wafer during the assembly of the second chips. In that case, a separation step is applied afterwards in known manner.

Figure 1B:
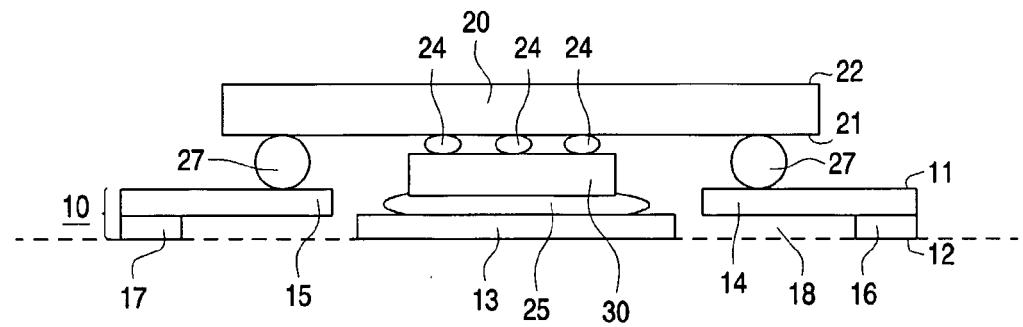

FIG. 1B shows the situation after the ensemble 50 of the first chip 20 and the second chip 30 has been attached to the first side 11 of the substrate. The back 32 of the second chip 30 is then pressed into the adhesive layer 25, while the solder dots and the solder balls are mutually connected into a metal interconnection 27. As will be understood by those skilled in the art, the metal interconnection 27 is not solid until after a heat treatment. The solder used here is a low-melting SAC solder which contains over 96% Sn, 3% Ag and about 0.5% Cu. The fact that the conductive interconnections 14, 15 are slightly and reversibly bent during the attaching of the ensemble 50 is not shown. This is possible because there is an elastic layer underneath the conductive interconnections 14, 15, here a layer of air. The bending provides an upward pressure on the conductive interconnections 14, 15.

Figure 1C:
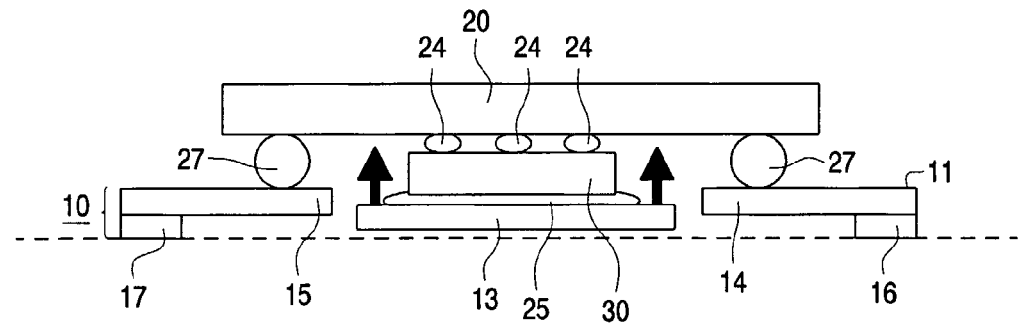

FIG. 1C shows the situation after the curing of the conductive adhesive. This takes place by means of a heat treatment at 100-150° C. The heat sink 13 of the lead frame is then pulled up when the adhesive layer 25 shrinks. The result is a downward pressure. Instead of a conductive adhesive, a solder may be applied. This does not change the principle, but leads to a heat treatment at a higher temperature.

Figure 1D:
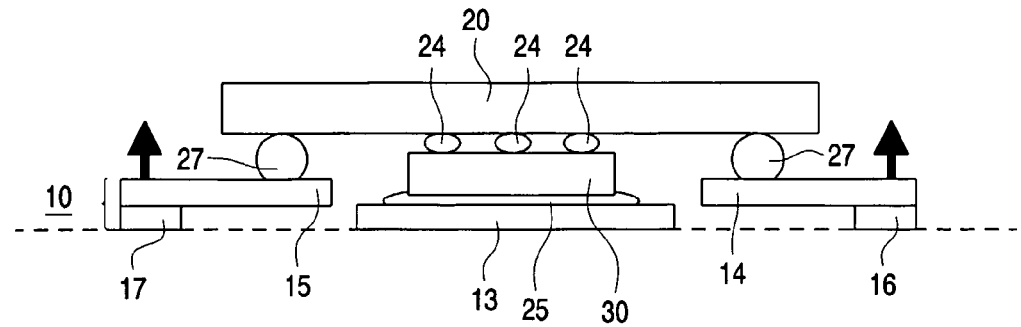

FIG. 1D shows the situation after the metal interconnections 27 are heated to beyond their reflow temperature and have been able to distort. Without the connection with the substrate 10 or the first chip 20 being broken, the metal interconnections 27 are flattened. The result is that the stress in the conductive interconnections 14, 15 and the heat sink 13 is relaxed.

Tests have been carried out to determine the strength and stability of the solder connections thus made with the assemblies having the underbump metallisation of copper. The High Temperature Storage Test—also known as HTSL Test—was done at 200° C. After 96 hours, 17 out of 18 samples were still okay for the first interconnect between the first and the second chip. The Temperature Cycle Life Test—also known as TMCL—was done from—55 to +125° C. After 1000 cycles 17 out of 18 samples were still okay. For the second interconnect, the HTSL gave a result of 16 out of 18 after 96 hours, and the TMCL gave a result of 18 out of 18 after 1000 cycles. The conclusion is that the system works properly.

Figure 2:
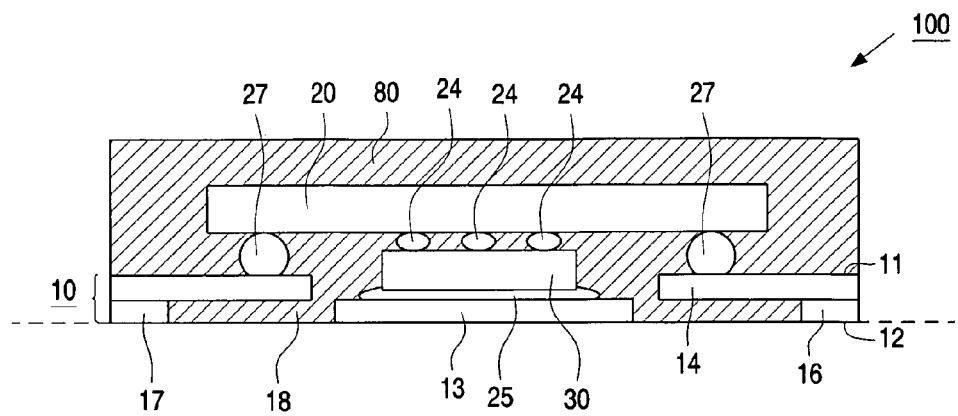
FIG. 2 shows a cross-section of the device obtained.

FIG. 2 shows the final device 100 once the encapsulation 80 has been applied. The encapsulation comprises a passivating material known per se, such as a glass-filled epoxy, a polyimide or another resin that has been chosen for the desired coefficient of expansion by the expert. In this case, the substrate 10 is embedded in the encapsulation 80 while also the openings 18 are filled and the contact surfaces on the second side 12 can be reached for external contacting. Solder balls, also of the lead-free type, may be applied to this, after which the device as a whole is ready to be placed on a carrier such as a printed circuit board. From the outside, the device 100 then does not differ from any other semiconductor device.

Figure 3:
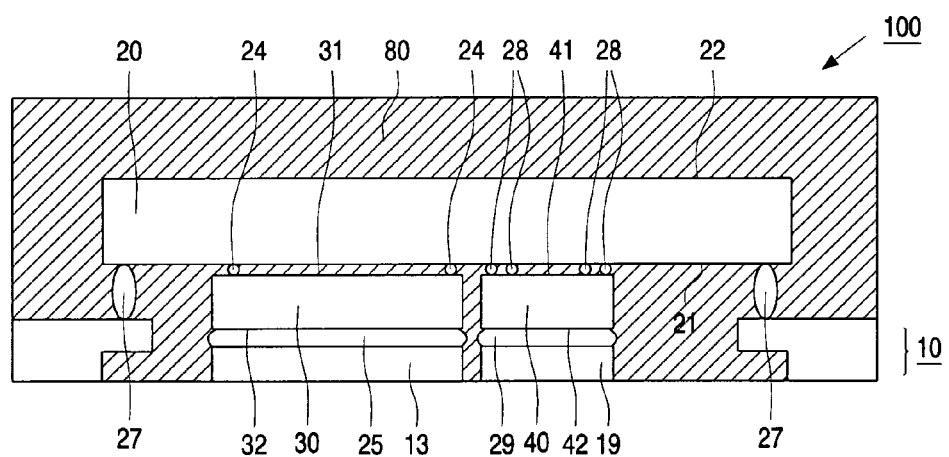
FIG. 3 shows a cross-section of a second embodiment of the device.

FIG. 3 shows in cross-section a second embodiment of the device 100. In this embodiment a third chip 40 is present in addition to a second chip 30. Both chips 30, 40 face the active side 21 of the first chip 20 with their active sides 31, 41. First and third metal interconnections 24, 28 then provide the electrical contact. Via adhesive layers 25, 29 the chips 30, 40 are connected with their backsides 32, 42 to a first heat sink 13 and a second heat sink 19, respectively. The heat sinks 13, 19 are not electroconductively interconnected, and may be driven at different voltages, for example +5 volts and −5 volts, as desired. The second and third chips 30, 40 are in this case amplifiers for various frequency bands. The first chip 20 applied here is the so-called passive chip and comprises the substrate of high-ohmic silicon in which vertical capacitors are defined. Furthermore, on the first side 21 there are defined: resistors, planar capacitors having a smaller capacitance than the vertical capacitors, coils and conductive interconnections.

The invention claimed is:

1. A method of assembly of a first chip to a second chip comprising the steps of:
providing a plurality of bond pads at a surface of the first chip with a solder composition, said bond pads being provided with an underbump metallization;
providing the second chip, which, at a surface, has a plurality of bond pads on which a metallization is present;
assembling the first and the second chip, such that at least part of the bond pads of the first chip and the corresponding bond pads of the second chip face each other, and
forming electrical connections between the bond pads at the first and the second chip by heating,
wherein the solder composition is provided as a fluid layer on the underbump metallization, which layer makes a contact angle of less than 90° with the underbump metallization, and an intermetallic compound is formed on the basis of the metallization at the second chip and at least one element of the solder composition.

2. A method as claimed in claim 1, wherein the metallization at the second chip has a surface flattened using electroplating of the metallization.

3. A method as claimed in claim 1, wherein the first chip is provided with further bumps of a larger height on top of the solder composition, said first chip extending laterally beyond the second chip.

4. A method as claimed in claim 1, wherein an alloying element of the solder composition is chosen from the group of Sn, In and Ge, and wherein the metallization at the second chip comprises an element chosen from the group of Au, Cu, Ni, Pd, Pt and Co.

5. A method as claimed in claim 4, wherein the alloying element of the solder composition is Sn, and wherein the metallization at the second chip comprises an element chosen from the group of Au, Cu and Ni.

6. A method as claimed in claim 5, wherein the underbump metallization on the bond pads of the first chip comprises nickel, and the bumps are provided by immersion of the first chip into a bath of a low-melting Sn alloy.

7. A method as claimed in claim 3, wherein the underbump metallization on the bond pads of the first chip comprises copper.

8. A method of assembly of a first chip to a second chip comprising the steps of:
providing a plurality of bond pads at a surface of the first chip with a solder composition, said bond pads being provided with an underbump metallization;
providing the second chip, which, at a surface, has a plurality of bond pads on which a metallization is present;
assembling the first and the second chip, such that at least part of the bond pads of the first chip and the corresponding bond pads of the second chip face each other; and
forming electrical connections between the bond pads at the first and the second chip by heating,
wherein the solder composition is provided as a fluid layer on the underbump metallization which layer makes a contact angle of less than 90° with the underbump metallization, and an intermetallic compound is formed on the basis of the metallization at the second chip and at least one element of the solder composition, and
wherein the heating step is a thermode bonding step, wherein the first chip is heated to a temperature between 50 and 200° C., and the second chip is heated to a temperature suitable for the formation of the intermetallic compound.

9. An assembly of a first chip and a second chip, both of which comprise a semiconductor substrate and a surface with bond pads that are exposed in apertures in a passivation layer, said surfaces facing each other, and a plurality of bond pads on the first chip being electrically connected to corresponding bond pads at the second chip through a solder interconnection, wherein the solder interconnection is a layer sandwiched between a first underbump metallization and a second metallization, which layer has a thickness that is smaller than that of the metallizations, an intermetallic compound being present at an interface of said layer and said second metallization.

10. An assembly as claimed in claim 9, wherein the length of the solder interconnection is less than 50 μm.

11. An assembly as claimed in claim 9, wherein the intermetallic compound is chosen from the group of AuSn and CuSn.

12. An assembly as claimed in claim 9, wherein the first chip extends laterally beyond the second chip and is provided with bumps that are present on top of the solder interconnection layer.

13. The assembly of claim 9, wherein the first chip and the second chip have semiconductor substrates with a same coefficient of thermal expansion.

14. The method of claim 1, wherein the contact angle is less than 60 degrees.

15. The method of claim 1, wherein the contact angle is less than 40 degrees.

16. The assembly of claim 9, wherein the plurality of bond pads on the first chip have different sizes and the same thickness for underbump metallization.

\* \* \* \* \*